United States Patent
Ogawa

(10) Patent No.: US 11,230,427 B2
(45) Date of Patent: Jan. 25, 2022

(54) SUBSTRATE STORAGE CONTAINER WITH UMBRELLA-SHAPED SEAL LIP

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

(*) Notice: Subject to any disclaimer, the term of this patent is extended or adjusted under 35 U.S.C. 154(b) by 0 days.

(21) Appl. No.: 17/041,461

(22) PCT Filed: Mar. 1, 2019

(86) PCT No.: PCT/JP2019/008108
§ 371 (c)(1),
(2) Date: Sep. 25, 2020

(87) PCT Pub. No.: WO2019/187982
PCT Pub. Date: Oct. 3, 2019

(65) Prior Publication Data
US 2021/0032014 A1 Feb. 4, 2021

(30) Foreign Application Priority Data
Mar. 28, 2018 (JP) .............................. JP2018-061635

(51) Int. Cl.
*B65D 85/30* (2006.01)
*H01L 21/673* (2006.01)

(52) U.S. Cl.
CPC ............ *B65D 85/30* (2013.01); *H01L 21/673* (2013.01)

(58) Field of Classification Search
CPC ........ B65D 81/20; B65D 85/30; B65D 85/38; B65D 85/90; F16K 15/14; F16K 27/02;
(Continued)

(56) References Cited

U.S. PATENT DOCUMENTS 2,912,999 A 11/1959 Ronald et al.
5,931,352 A 8/1999 Dirr
(Continued)

FOREIGN PATENT DOCUMENTS

JP S34001937 4/1959
JP S42012434 7/1967
(Continued)

OTHER PUBLICATIONS

"International Search Report (Form PCT/ISA/210) of PCT/JP2019/008108," dated May 28, 2019, with English translation thereof, pp. 1-4.

*Primary Examiner* — Bryon P Gehman
(74) *Attorney, Agent, or Firm* — JCIP Global Inc.

(57) ABSTRACT

Corrosion resistance of valves is enhanced, while ensuring the check valve function of the valves against an inflow of outside air. Disclosed is a substrate storage container that includes: a container body for storing at least one substrate; a lid for closing an opening of the container body; and at least one valve for controlling gas flow to the container body or from the container body. The at least one valve includes an elastic, non-metallic seal lip in a communication passage that extends in a first direction and communicates between an outside of the container body and an inside of the container body. The seal lip has an umbrella-like form which closes on one side in the first direction and opens on the other side in the first direction, the seal lip abutting an inner peripheral wall of the communication passage on the other side.

7 Claims, 9 Drawing Sheets

(58) Field of Classification Search
CPC . H01L 21/67; H01L 21/673; H01L 21/67379;
H01L 21/67393
USPC .................................................. 206/710, 711
See application file for complete search history.

(56) References Cited

U.S. PATENT DOCUMENTS

| | | | |
|---|---|---|---|
| 7,950,524 B2 * | 5/2011 | Lin | ................... H01L 21/67393 |
| | | | 206/711 |
| 8,727,125 B2 * | 5/2014 | Tieben | .............. H01L 21/67379 |
| | | | 206/711 |
| 2004/0069815 A1 | 4/2004 | Masuda | |
| 2009/0266441 A1 | 10/2009 | Sato | |
| 2017/0271188 A1 | 9/2017 | Fuller et al. | |

FOREIGN PATENT DOCUMENTS

| | | |
|---|---|---|
| JP | S55109175 | 7/1980 |
| JP | H02047487 | 3/1990 |
| JP | H08203993 | 8/1996 |
| JP | 2000034762 | 2/2000 |
| JP | 2004161343 | 6/2004 |
| JP | 2004179449 | 6/2004 |
| JP | 2008066330 | 3/2008 |
| JP | 2018505546 | 2/2018 |

* cited by examiner

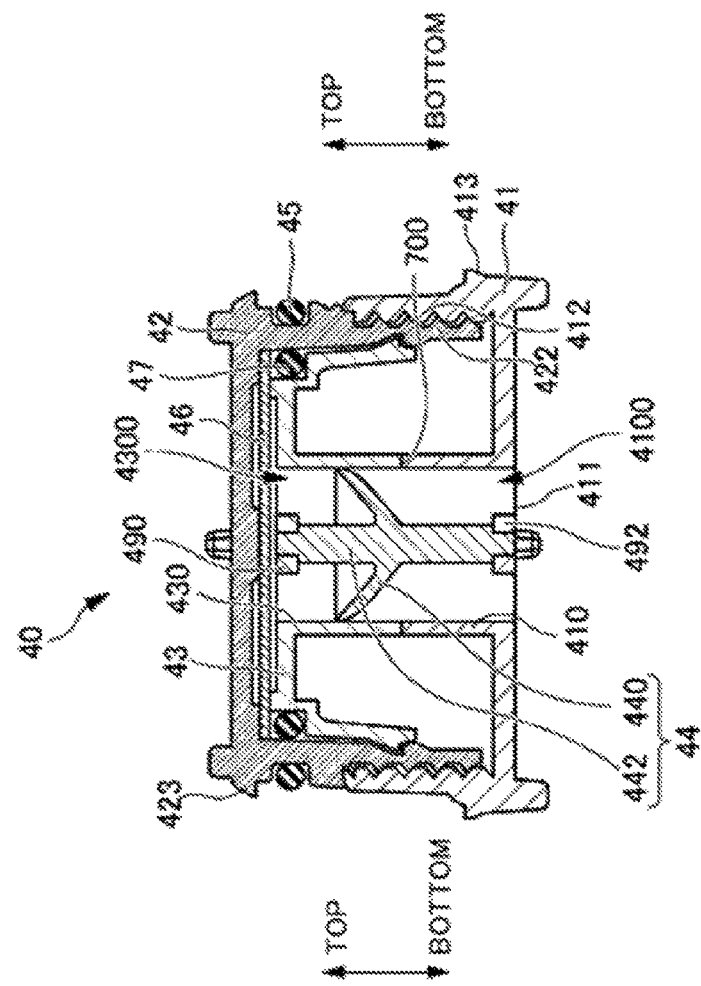
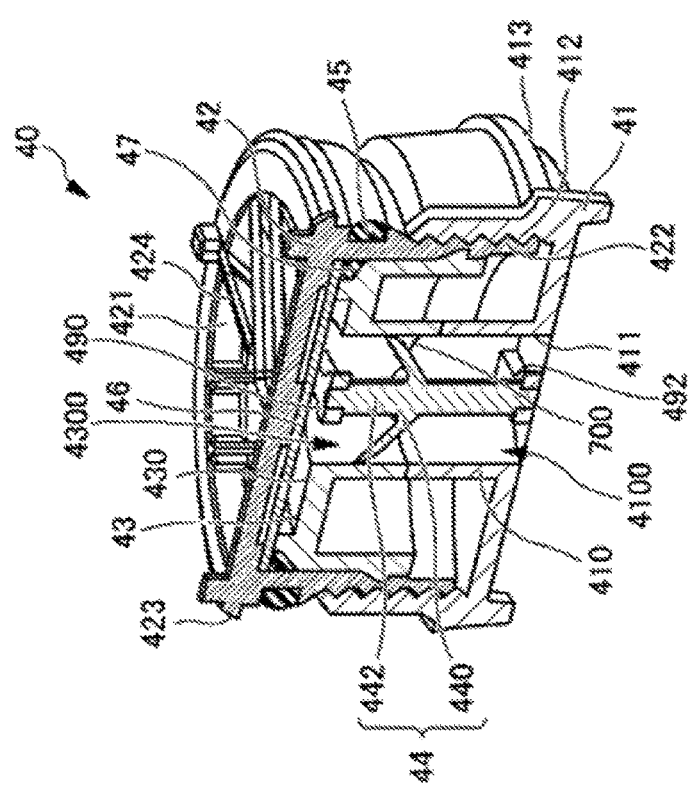
FIG. 2A
FIG. 2B

SUBSTRATE STORAGE CONTAINER WITH UMBRELLA-SHAPED SEAL LIP

CROSS-REFERENCE TO RELATED APPLICATION

This application is a 371 application of the international PCT application serial no. PCT/JP2019/008108, filed on Mar. 1, 2019, which claims the priority benefits of Japan application no. 2018-061635, filed on Mar. 28, 2018. The entirety of each of the abovementioned patent applications is hereby incorporated by reference herein and made a part of this specification.

TECHNICAL FIELD

The present disclosure relates to a substrate storage container.

BACKGROUND ART

Substrate storage containers for containing substrates include: a container body; a lid for closing an opening of the container body; and valves for controlling gas flow for the container body. The valves have a check valve function. Each valve has a valve body and a metallic elastic member for opening and closing the valve body (see, e.g., Patent Literatures 1 and 2).

CITATION LIST

Patent Literature

[Patent Literature 1] Japanese Unexamined Patent Application Publication No. 2008/066330
[Patent Literature 2] Japanese Unexamined Patent Application Publication No. 2004/179449

SUMMARY

Technical Problem

However, in the prior art, it is difficult to enhance corrosion resistance of the valves while ensuring the function of the valves as a check valve against an inflow of outside air. Gas is supplied to the substrate storage containers via the valves and exhausted from the substrate storage containers via the valves for gas purging or the like. At this time, residual materials on the substrates in the substrate storage containers (which have been deposited during processing of the substrates) are discharged via the valves together with the supplied gas. As a result, the metallic elastic members or the like of the valves may be corroded by the residual materials.

Hence, one aspect of the present disclosure is directed to enhance the corrosion resistance of the valves, while ensuring the check valve function of the valves against an inflow of outside air.

Solution to Problem

One aspect of the disclosure provides the following solutions.

A substrate storage container of the disclosure includes: a container body for storing at least one substrate; a lid for closing an opening of the container body; and at least one valve for controlling gas flow to the container body or from the container body. The at least one valve includes an elastic, non-metallic seal lip in a communication passage that extends in a first direction and communicates between an outside of the container body and an inside of the container body. The seal lip has an umbrella-like form which closes on one side in the first direction and opens on the other side in the first direction, the seal lip abutting an inner peripheral wall of the communication passage on the other side.

In the above-described configuration, the at least one valve further includes a shaft portion that extends along the first direction. The seal lip extends around the shaft portion when viewed in the first direction, and an end of the seal lip on the one side is coupled to the shaft portion.

In the above-described configuration, the substrate storage container further includes a first circular cylindrical part and a second circular cylindrical part which abut each other in the first direction and form the communication passage. At least one of the first circular cylindrical part and the second circular cylindrical part supports an end of the shaft portion in the first direction.

In the above-described configuration, the first circular cylindrical part supports one end side of the shaft portion in the first direction, and the second circular cylindrical part supports the other end side of the shaft portion in the first direction.

In the above-described configuration, a position where the first circular cylindrical part and the second circular cylindrical part abut in the first direction is located on the other side in the first direction than a position where the seal lip abuts the inner peripheral wall.

In the above-described configurations, the communication passage is partitioned by the seal lip into a first passage that communicates with the outside of the container body and a second passage that communicates with the inside of container body. The seal lip is elastically deformed in a manner away from the inner peripheral wall of the communication passage depending on a difference between a pressure in the first passage and a pressure in the second passage.

In the above-described configurations, the seal lip has a first region and a second region in a circumferential direction about the center when viewed in the first direction, the first region and the second region having different thicknesses.

In the above-described configuration, the first region has a strip-like form extending from the one side to the other side, the first region having the thickness greater than the thickness of the second region.

In the above-described configuration, the first region is provided at a plurality of locations in a manner away from each other in the circumferential direction about the center when viewed in the first direction.

Advantageous Effects of Invention

In one aspect, the present disclosure enables to enhance corrosion resistance of the valves while ensuring the check valve function of the valves against an inflow of outside air.

BRIEF DESCRIPTION OF DRAWINGS

FIG. 2A shows a valve that is provided at an air supply unit in a perspective sectional view (i.e. a perspective view showing a cut end in a sectional view, the same applies hereafter).

FIG. 2B is a sectional view showing the valve that is provided at the air supply unit.

DESCRIPTION OF EMBODIMENTS

Hereinafter, each example will be described in detail with reference to the accompanying drawings.

Figure 1:
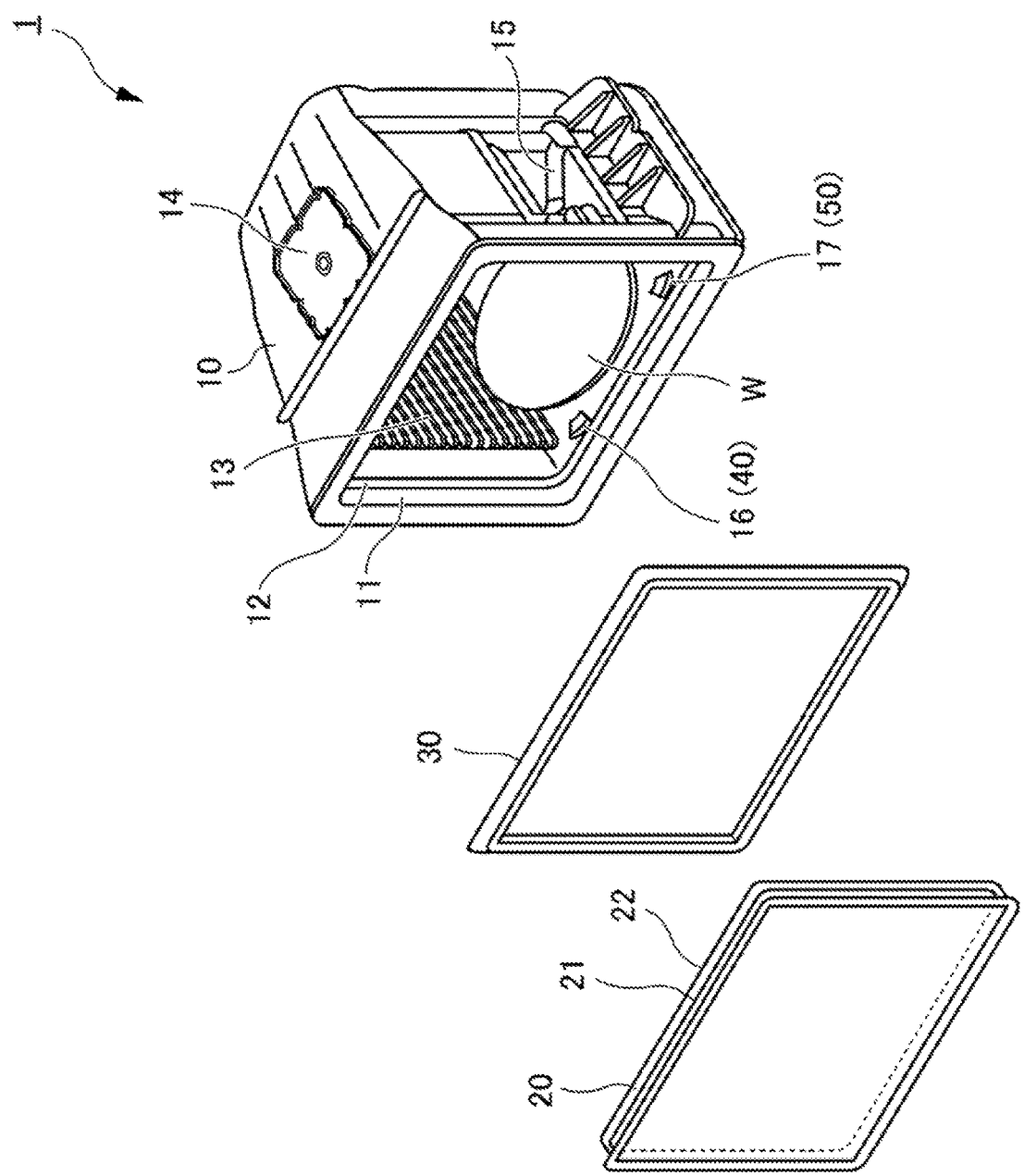
FIG. 1 is a schematic exploded perspective view showing a substrate storage container according to Example 1.

[Example 1] FIG. 1 is a schematic exploded perspective view showing a substrate storage container 1 according to Example 1.

The substrate storage container 1 includes: a container body 10 for storing at least one substrate W; a lid 20 for closing an opening 11 of the container body 10; an annular packing 30 provided between the container body 10 and the lid 20; and at least one valve 40, 50.

The container body 10 is a box-like body and is a front open type having the opening 11 in front. The opening 11 is formed by bending with a step so as to extend outward. A surface of such stepped portion, which is formed on a front inner peripheral edge of the opening 11, is a seal face 12 to which the packing 30 contacts. The container body 10 is preferably the front open type, since it is easy to insert the at least one substrate W having a diameter of 300 mm or 450 mm. However, the container body 10 may be a bottom open type, in which the opening 11 is formed in a lower surface.

Support bodies 13 are disposed on both right and left sides inside the container body 10. The support bodies 13 have a function of carrying and positioning the substrates W. Each support body 13 has multiple grooves formed in the height direction, constituting so-called groove teeth. Each substrate W is placed on two groove teeth of the same height on the right and left. A material of the support bodies 13 may be the same as that of the container body 10, but a different material may be used to improve cleaning property and slidability.

Inside the container body 10, a rear retainer (not shown) is disposed at the rear (back side) of the container body 10. When the lid 20 is closed, the rear retainer holds the substrates W in pairs with a front retainer described later.

However, the rear retainer may not be provided. Alternatively, the support bodies 13 may have, e.g., substrate retaining portions having a "<" shape or a linear shape on the back side of the groove teeth so that the substrates W are held by the front retainer and the substrate retaining portions. The support bodies 13 and the rear retainer are provided on the container body 10 by insert-molding, fitting or the like.

The substrates W are supported by the support bodies 13 and stored in the container body 10. An example of the substrates W is a silicon wafer. However, the substrates W are not particularly limited thereto and may be a quartz wafer, a gallium arsenide wafer or the like.

On a middle portion of a ceiling of the container body 10, a robotic flange 14 is detachably provided. A conveying robot in a factory grips the robotic flange 14 of the substrate storage container 1 in which the substrates W are airtightly stored in a clean condition. The robot conveys it to a processing device for each process for processing the substrates W.

Further, on middle portions of outer surfaces of both sides of the container body 10, manual handles 15 are respectively provided in a detachable manner, which are gripped by an operator.

On an inner bottom surface of the container body 10, an air supply unit 16 and an air exhaust unit 17 are provided. On an outer bottom surface of the container body 10, valves 40, 50 are attached as described later. These are arranged such that an inert gas such as nitrogen gas or dry air: is supplied from the air supply unit 16 to the inside of the substrate storage container 1 closed by the lid 20; and is discharged from the air exhaust unit 17 as required. Thereby, the gas inside the substrate storage container 1 is replaced; airtightness is kept with a low humidity; or impurity substances on the substrates W are blew away. Thus, the cleanliness inside the air supply unit 1 is maintained. In addition to supplying the gas from the air supply unit 16, the air exhaust unit 17 may be connected to a negative pressure (vacuum) generator so that the gas is forcibly exhausted from the air exhaust unit 17.

Further, by detecting the gas exhausted from the air exhaust unit 17, it is possible to confirm whether the inside of the substrate storage container 1 has been replaced with the introduced gas. The air supply unit 16 and the air exhaust unit 17 are preferably in a position deviated from the position of the substrates W projected on the bottom surface. However, the numbers and positions of the air supply unit 16 and the air exhaust unit 17 are not limited to those shown. The air supply unit 16 and the air exhaust unit 17 may be located at the four corners of the bottom surface of the container body 10. The air supply unit 16 and the air exhaust unit 17 may be attached on the lid 20 side.

The lid 20 has a substantially rectangular shape and is attached to the front surface of the opening 11 of the container body 10. The lid 20 has a locking mechanism (not shown) and is locked by a latch claw to be engaged in a latch hole (not shown) formed in the container body 10. On a middle portion of the lid 20, the elastic front retainer (not shown) is detachably mounted or integrally formed. The front retainer horizontally holds a front peripheral edge of each substrate W.

Similarly to the groove teeth and the substrate retaining portions of the support body 13, this front retainer is a member to be in direct contact with the wafers. Hence, the front retainer is made of a material having good cleaning property and slidability. The front retainer may also be provided on the lid 20 by insert-molding, fitting or the like.

The lid 20 has an attachment groove 21 in which the packing 30 is attached. More specifically, a convex portion 22 is provided on a surface of the lid 20 on the container body 10 side. The convex portion 22 is formed so as to be annular and smaller than the stepped portion of the opening 11, thereby forming the annular attachment groove 21 having a substantially U-shaped cross section. When the lid 20 is attached to the container body 10, the convex portion 22 is inserted deeper than the stepped portion of the opening 11.

Examples of a material of the container body 10 and the lid 20 include a thermoplastic resin such as polycarbonate, polybutylene terephthalate, cycloolefin polymer, polyetherimide, polyether sulfone, polyether ether ketone and liquid crystal polymer. The thermoplastic resin may include a conductive agent such as conductive carbon, conductive fiber, metal fiber and conductive polymer; antistatic agents; and ultraviolet absorbers, which are added appropriately.

The packing 30 has an annular shape corresponding to the front shape of the lid 20 (and the shape of the opening 11 of the container body 10). In Example 1, the packing 30 has a rectangular frame shape. However, the annular packing 30 may have a circular (ring) shape before attachment to the lid 20.

The packing 30 is disposed between the seal face 12 of the container body 10 and the lid 20. When the lid 20 is attached to the container body 10, the packing 30 is in close contact with the seal face 12 and the lid 20, thereby: securing the airtightness of the substrate storage container 1; reducing penetration of dust, moisture and the like from the outside into the substrate storage container 1; and reducing leakage of gas from the inside to the outside of the substrate storage container 1.

As a material of the packing 30, it is possible to use a thermoplastic elastomer such as a polyester-based elastomer, a polyolefin-based elastomer, a fluorine-based elastomer, a urethane-based elastomer and the like; or an elastic material such as a fluororubber, an ethylene propylene rubber and a silicone-based rubber. From the viewpoint of modifying the sealing property, these materials may include a filler made of carbon, glass fiber, mica, talc, silica, calcium carbonate and the like; and a resin such as polyethylene, polyamide, polyacetal, a fluorine-based resin and a silicone resin, which are added selectively in a predetermined amount.

Hereinafter, the at least one valve 40 will be described. FIG. 2A shows the valve 40 in a perspective sectional view. FIG. 2B shows the valve 40 in a sectional view. In FIGS. 2A and 2B, a top-bottom direction (an example of a first direction) is indicated. Note that, the direction in which the valve 40 is attached is not limited to the orientation shown in FIGS. 2A and 2B.

The valve 40 controls gas flow for the container body 10. When attached to the container body 10, the valve 40 communicates with the air supply unit 16 through an air flow path not shown.

As shown in FIGS. 2A and 2B, the valve 40 has a fixation cylinder 41 and a holding cylinder 42. The fixation cylinder 41 is fitted from below into a through hole 18 (see FIGS. 3A and 3B) formed by a rib 180 of the container body 10. The holding cylinder 42 is fitted from above via a seal member 45 into the through hole 18. The holding cylinder 42 is detachably combined with the fixation cylinder 41 from above by screwing.

The fixation cylinder 41 has a bottomed cylindrical shape with an opening on the inner side of the container body 10. On an inner peripheral surface of the fixation cylinder 41, thread grooves 412 for receiving the holding cylinder 42 are threadably formed. On an outer peripheral surface of the fixation cylinder 41, a ring-shaped flange 413 extending radially outward is circumferentially provided so as to contact an open peripheral portion of the rib 180.

On the center of a bottom portion of the fixation cylinder 41, a first cylinder portion 410 (an example of a first circular cylindrical part) and a vent 411 for gas flow are formed. The first cylinder portion 410 communicates, at one end, with the outside of the container body 10. The first cylinder portion 410 rises from a periphery of the vent 411 and extends toward the hold cylinder 42 while communicating with the vent 411. The first cylinder portion 410 and the vent 411 form a first passage 4100.

The holding cylinder 42 has a bottomed cylindrical shape with an opening on the outer side of the container body 10. On an outer peripheral surface of the holding cylinder 42, a ring-shaped flange 423 extending radially outward is circumferentially provided so as to contact an open peripheral portion of the through hole 18. On the outer peripheral surface of the holding cylinder 42, thread grooves 422 for attaching to the fixation cylinder 41 are threadably formed. These thread grooves 422 are screwed with the thread grooves 412 of the fixation cylinder 41. However, the fixation cylinder 41 and the holding cylinder 42 may be attached to each other in other manners other than screwing such as press fitting or engagement.

The holding cylinder 42 is provided with partition ribs 424 for partitioning a plurality of vents 421 for gas flow on the inner side (of a bottom surface) of the container body 10. The partition ribs are arranged in a grid manner or radially. On a rear surface of the partitioning ribs, a storage space for storing a below-mentioned filter 46 is formed.

Attached on the outer peripheral surface of the holding cylinder 42 is a seal member 45. The seal member 45 blocks outside air or cleaning fluid from entering the inside of the container body 10 from between the holding cylinder 42 and an inner peripheral surface of the through hole 18. The seal member 45 also blocks gas leakage from the inside of the container body 10.

The valve 40 is attached to an inner peripheral wall of the holding cylinder 42 via a seal member 47. The valve 40 also has an inner lid cylinder 43. The inner lid cylinder 43 and the holding cylinder 42 hold the filter 46 therebetween.

The inner lid cylinder 43 has a bottomed cylindrical shape with an opening on the outer side of the container body 10. The inner lid cylinder 43 is formed such that the filter 46 is placed on the inner side of the container body 10. On an outer peripheral surface of the inner lid cylinder 43, a protrusion is formed to engage with an engagement groove formed on an inner peripheral surface side of the holding cylinder 42. The inner lid cylinder 43 is thus connected and attached to the holding cylinder 42.

The inner lid cylinder 43 communicates, at one end, with the inside of the container body 10. The inner lid cylinder 43 is provided with a second cylinder portion 430 (an example of a second circular cylindrical part). The second cylinder portion 430 and the first cylinder portion 410 abut each other in an axial direction. The position where the second cylinder portion 430 abuts the first cylinder portion 410 is indicated by reference sign 700. In FIGS. 2A and 2B, the position where the second cylinder portion 430 abuts the first cylinder portion 410 is lower than an upper end of a below-mentioned seal lip 440. However, the position may be above the upper end of the seal lip 440. In either case, even if gas leaks through the abutment position where the second cylinder portion 430 abuts the first cylinder portion 410, the seal members 45, 47 prevent the gas from entering the inside of the container body 10. However, when the abutment position where the second cylinder portion 430 abuts the first cylinder portion 410 is located above the upper end of the seal lip 440; and if the gas flows in the direction shown in FIG. 3A, there is a risk that the gas leaks to the outside and the pressure inside the container body 10 is reduced. Hence, in such a configuration, measures may be taken, such as: disposing another seal member made of an elastic body at the position 700 where the second cylinder portion 430 abuts the first cylinder portion 410; or providing means to enhance the sealing property.

The second cylinder portion 430 rises from a periphery of a central opening and extends toward the first cylinder portion 410 that is formed in the fixation cylinder 41, while communicating with a vent 421. The second cylinder portion 430 and the vent 421 form a second passage 4300. The second passage 4300 cooperates with the first passage 4100 described above to form a communication passage for communication between the outside of the container body 10 and the inside of the container body 10.

In Example 1, an inner diameter of the communication passage formed by the first cylinder portion 410 and the second cylinder portion 430 is constant over the entire extending range of the communication passage. However, the inner diameter may vary.

The above-mentioned fixation cylinder 41, hold cylinder 42 and inner lid cylinder 43 are molded using materials, e.g., a thermoplastic resin such as polycarbonate, polyetherimide, polyether ether ketone, polybutylene terephthalate or a liquid crystal polymer. The seal members 45,47 are an O-ring or the like formed of a material such as fluororubber, NBR rubber, urethane rubber, EPDM rubber or silicone rubber.

In Example 1, the valve 40 has an elastic body 44 in the communication passage that is formed by the first cylinder portion 410 and the second cylinder portion 430. The elastic body 44 is employed depending on the air supply unit 16. The valve 40 controls the gas flow for the container body 10 by means of deformation of the elastic body 44. The valve 40 has a one-way check valve function of enabling gas supply to the inside of the container body 10, while disabling gas exhaust from the container body 10 to the outside. Thus, the elastic body 44 separates the first passage 4100 communicating with the outside of the container body 10 and the second passage 4300 communicating with the inside of the container body 10.

The elastic body 44 includes a seal lip 440 and a shaft portion 442.

The seal lip 440 has a function to open and close the communication passage by elastically deforming depending on a differential pressure between both sides of its installation position in the communication passage. As shown in FIGS. 2A and 2B, the seal lip 440 has an umbrella-like form which closes on the lower side in the top-bottom direction and opens on the upper side. The seal lip 440 abuts an inner peripheral wall of the second cylinder portion 430 (an example of an inner peripheral wall of the communication passage) on the upper side. The seal lip 440 extends obliquely upward and outward (away from the shaft portion 442) from the shaft portion 442, when viewed in cross section through the centerline of the shaft portion 442. The seal lip 440 may have a constant thickness when viewed in cross section through the centerline of the shaft portion 442. However, the thickness of the seal lip 440 may become thinner as it proceeds away from the shaft portion 442, as shown in FIGS. 2A and 2B. As a single piece, the seal lip 440 itself has an outer diameter that is slightly larger than the inner diameter of the second cylinder portion 430. Hence, when the elastic body 44 is installed, the seal lip 440 is elastically deformed and abuts the inner peripheral wall of the second cylinder portion 430.

In Example 1, the seal lip 440 has a uniform cross section in the cross section through the shaft portion 442. However, in other Examples below, the seal lip 440 has different sectional forms.

The shaft portion 442 continues from a lower end of the seal lip 440. That is, the shaft portion 442 is coupled to the lower end of the seal lip 440. The shaft portion 442 extends in the top-bottom direction. The shaft portion 442 may have a circular cross section in a planar cross section perpendicular to the extending direction of the shaft portion 442. The shaft portion 442 is supported by upper and lower supporters 490, 492. Specifically, an upper end of the shaft portion 442 is secured by the supporter 490, while a lower end of the shaft portion 442 is secured by the supporter 492. The supporter 490 may be formed on the second cylinder portion 430 in a manner protruding from the inner peripheral wall of the second cylinder portion 430. Similarly, the supporter 492 may be formed on the first cylinder portion 410 in a manner protruding from an inner peripheral wall of the first cylinder portion 410.

As a material of the elastic body 44, various rubbers, thermoplastic elastomer resins and the like can be used. For example, the material may be thermoplastic elastomers such as polyester-based elastomers, polyolefin-based elastomers, fluorine-based elastomers, and urethane-based elastomers; or rubber such as fluorine rubber, ethylene propylene rubber and silicone.

The filter 46 is for filtering the gas to be supplied or exhausted. The filter 46 is selected from a porous membrane made of tetrafluoroethylene, a polyester fiber, a fluorine-based resin or the like; a molecular filtration filter made of glass fiber or the like; a chemical filter in which a chemical adsorbent is carried by a filter medium such as an activated carbon fiber; and the like.

One or multiple filters 46 are held between the hold cylinder 42 and the inner lid cylinder 43 in the top-bottom direction. When multiple filters 46 are used, the filters may be of the same type. However, it is more preferable to combine those having different properties since contamination of organic substances and the like other than particles can also be prevented. For example, the filter 46 also functions to reduce transmission of fluid so that the fluid such as water or cleaning fluid does not remain when the container body 10 is cleaned. Hence, a hydrophobic or hydrophilic material may be used for one of the filters 44 in order to further reduce permeation of the fluid.

Figure 3A:
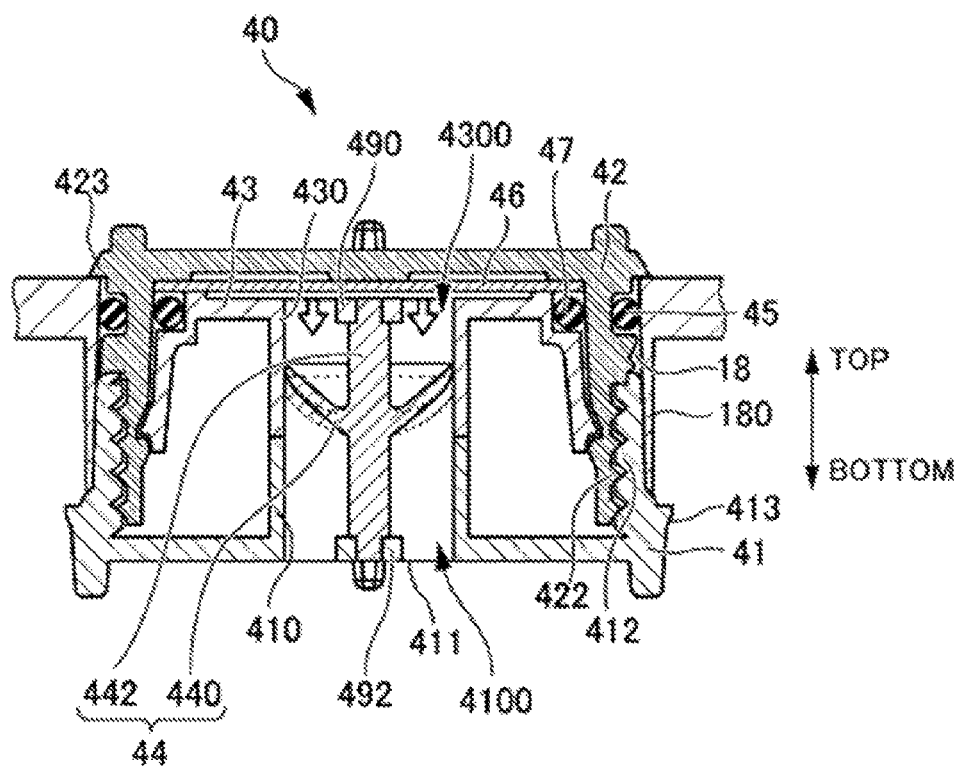
FIG. 3A is a schematic sectional view showing the valve attached to the substrate storage container in a state where gas flow is blocked.
Figure 3B:
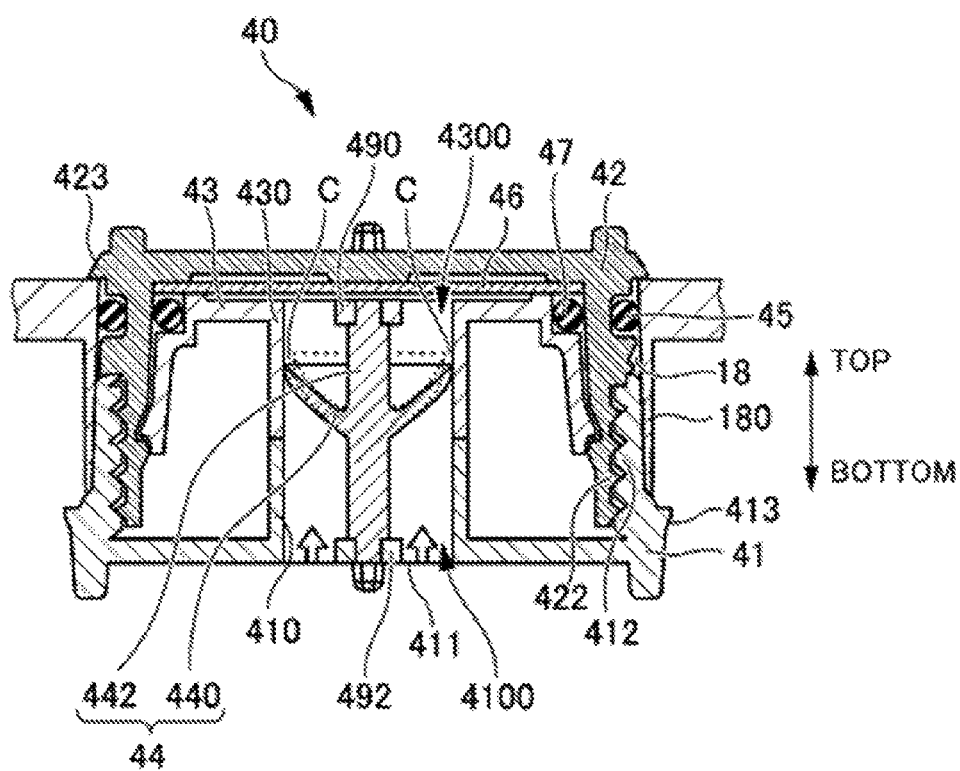
FIG. 3B is a schematic sectional view showing the valve attached to the substrate storage container in a state where the gas flow is enabled.

Hereinafter, it will be described how the at least one valve 40 controls the flow of gas. FIGS. 3A and 3B are schematic sectional views respectively showing the valve 40 attached to the substrate storage container 1 in a state where (a) gas flow is blocked and (b) the gas flow is enabled.

In FIG. 2, when no differential pressure is generated between the first passage 4100 of the first cylinder portion 410 and the second passage 4300 of the second cylinder portion 430, the seal lip 440 of the elastic body 44 abuts the inner peripheral wall of the second cylinder portion 430 to block the communication between the first passage 4100 and the second passage 4300, thereby blocking gas flow to both sides.

For example, as shown by the arrows in FIG. 3B, when a positive pressure of a predetermined value or more is applied to the first passage 4100 of the first cylinder portion 410 (i.e. when the pressure in the first passage 4100 becomes higher than the pressure in the second passage 4300 by a predetermined value or more), the elastic body 44 is deformed in a manner that the seal lip 440 bends upward depending on the magnitude of the positive pressure, thereby forming a clearance C against the inner peripheral wall of the second cylinder portion 430. The gas from the first cylinder portion 410 side passes through the clearance C and flows to the second cylinder portion 430 side to be supplied to the inside of the container body 10.

When a negative pressure of a predetermined value or more is applied to the second passage 4300 of the second cylinder portion 430, the elastic body 44 acts in the same manner as in the case where a positive pressure of a predetermined value or more is applied to the first passage 4100 of the first cylinder portion 410, forming the clearance C against the inner peripheral wall of the second cylinder portion 430.

On the other hand, when a positive pressure is applied to the second passage 4300 of the second cylinder portion 430 (i.e. when the pressure in the second passage 4300 becomes higher than the pressure in the first passage 4100), the elastic body 44 is deformed in a manner that the seal lip 440 bends downward, i.e. in the opposite direction, to be further pressed onto the inner peripheral wall of the second cylinder portion 430, as shown in FIG. 3A. Thereby, there is no clearance between the inner peripheral wall of the second cylinder portion 430 and the elastic body 44, the gas flow from the second cylinder portion 430 side is blocked, so that the gas cannot flow into the first cylinder portion 410 side.

Also, when a negative pressure of a predetermined value or more is applied to the first passage 4100 of the first cylinder portion 410, the elastic body 44 acts in the same manner as in the case where a positive pressure of a predetermined value or more is applied to the second passage 4300 of the second cylinder portion 430.

A pressure by which the seal lip 440 bends in a manner to form the clearance C for allowing the gas flow between the first passage 4100 and the second passage 4300 (i.e. an opening pressure of the seal lip 440) can be adjusted by changing the material, hardness, shape/dimensions of the elastic body 44; or the thickness of the seal lip 440. A preferable example of the thickness of the seal lip 440 will be described later.

Figure 4:
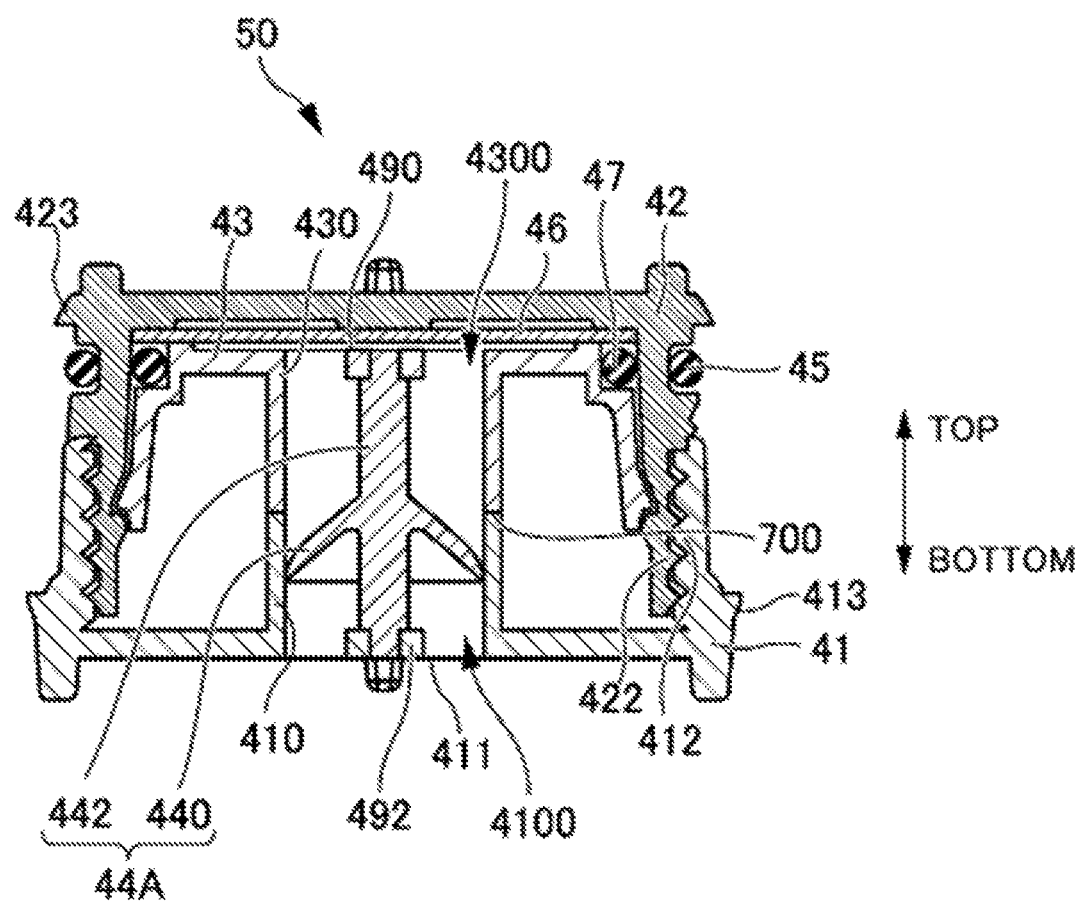
FIG. 4 is a sectional view showing the valve that is provided at an air exhaust unit.

A valve 50 controls gas flow for the container body 10. When attached to the container body 10, the valve 50 communicates with the air exhaust unit 17 through an air flow path not shown. As shown in FIG. 4, the valve 50 includes, in place of the elastic body 44, an elastic body 44A mounted upside down with respect to the valve 40. The valve 50 is used for the air exhaust unit 17, and enables gas exhaust from the container body 10 to the outside, while disables gas supply to the inside of the container body 10.

The elastic body 44A of the valve 50 only differs in orientation from the elastic body 44 of the valve 40, as shown in FIGS. 2 and 4. Accordingly, the seal lip 440 of the elastic body 44A abuts an inner peripheral wall of the first cylinder portion 410 on the lower side (an example of the inner peripheral wall of the communication passage), as shown in FIG. 4.

The valve 50 controls the gas flow substantially in the same manner as the valve 40 controls the gas flow, which is described above with reference to FIGS. 3A and 3B. That is, the valve 50 for the air exhaust unit 17 blocks or enables the gas flow in the inverted directions relative to the valve 40. Specifically, when a positive pressure of a predetermined value or more is applied to the second passage 4300 of the second cylinder portion 430, the elastic body 44 is deformed in a manner that the seal lip 440 bends downward depending on the magnitude of the positive pressure, thereby forming the clearance C against the inner peripheral wall of the first cylinder portion 410 (not shown). The gas from the second cylinder portion 430 side passes through the clearance C and flows to the first cylinder portion 410 side to be exhausted to the outside of the container body 10.

As described above, the substrate storage container 1 according to Example 1 includes: the container body 10 for storing the at least one substrate W; the lid 20 for closing the opening 11 of the container body 10; and the at least one valve 40, 50 that controls the gas flow for the container body 10. The valves 40, 50 have the elastic body 44 that partitions the first passage 4100 communicating with the outside of container body 10 and the second passage 4300 communicating with the inside of the container body 10. The elastic body 44 is deformed, when the pressure in the first passage 4100 becomes higher than the pressure in the second passage 4300 (i.e. when a differential pressure occurs), thereby enabling gas flow to the container body 10.

Hence, when the gas is introduced from one side of the valve 40 (causing a positive pressure); and when the differential pressure reaches the opening pressure, the clearance C of the elastic body 44 is formed, so that the introduced gas is supplied to the other side of the valve 40. The same applies to the valve 50.

Since the substrate storage container 1 includes the valves 40, 50, which do not use any metallic member, metallic corrosive residual materials, if any, on the substrates W to be stored do not cause metallic corrosion problems, and it is unlikely that the valves 40, 50 become inoperative.

Further, since it is possible to cause the gas flow in the air supply direction or the air exhaust direction only by inverting the attachment orientation of the elastic body 44 (see the elastic body 44A) upside down, various gas supply and exhaust routes can be feasible regardless of the positions or numbers of the air supply unit 16 and the air exhaust unit 17.

Next, another Example will be described. Hereinafter, the same reference signs are given to the components that may be the same as those in Example 1 described above, and description thereof may be omitted or simplified.

[Example 2] Example 2 differs from Example 1 described above in that the at least one valve 40 is replaced with at least one valve 40B. The at least one valve 40B differs from the at least one valve 40 of Example 1 described above in that the first cylinder portion 410 and the second cylinder portion 430 are replaced with a first cylinder portion 410B (an example of the first circular cylindrical part) and a second cylinder portion 430B (an example of the second circular cylindrical part), which are separate bodies.

Figure 5A:
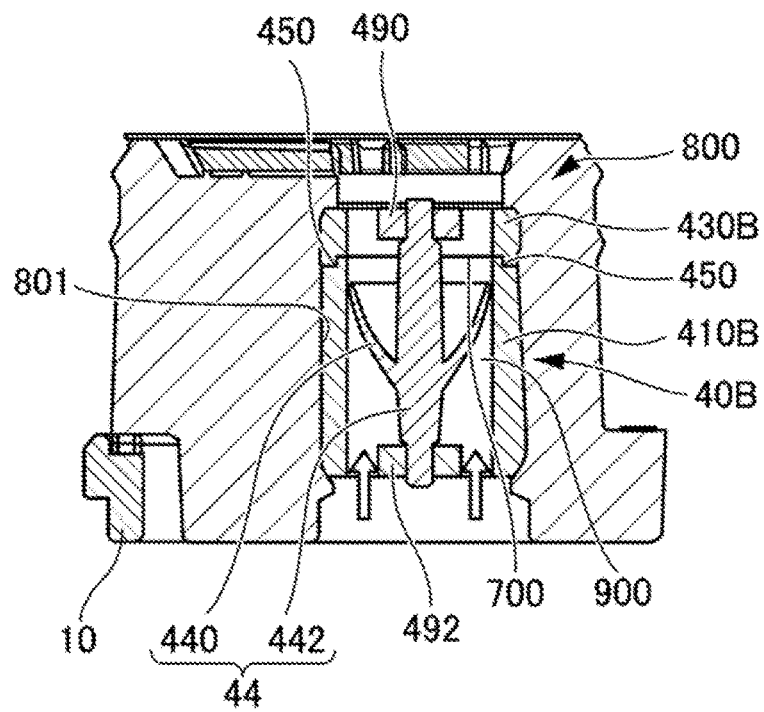
FIG. 5A is a perspective sectional view of a communication passage provided with a valve according to Example 2.

FIG. 5A is a perspective sectional view of a part including the valve 40B that communicates with the air supply unit 16.

The valve 40B is fitted in a rubber member 800 having a through hole 801 in the top-bottom direction. The rubber member 800 is provided on the container body 10. An inner diameter of the through hole 801 is significantly smaller than an outer diameter of the valve 40B. As a result, by inserting the valve 40B in the through hole 801 of the rubber member 800, the valve 40B is securely held in relation to the rubber member 800.

Figure 5B:
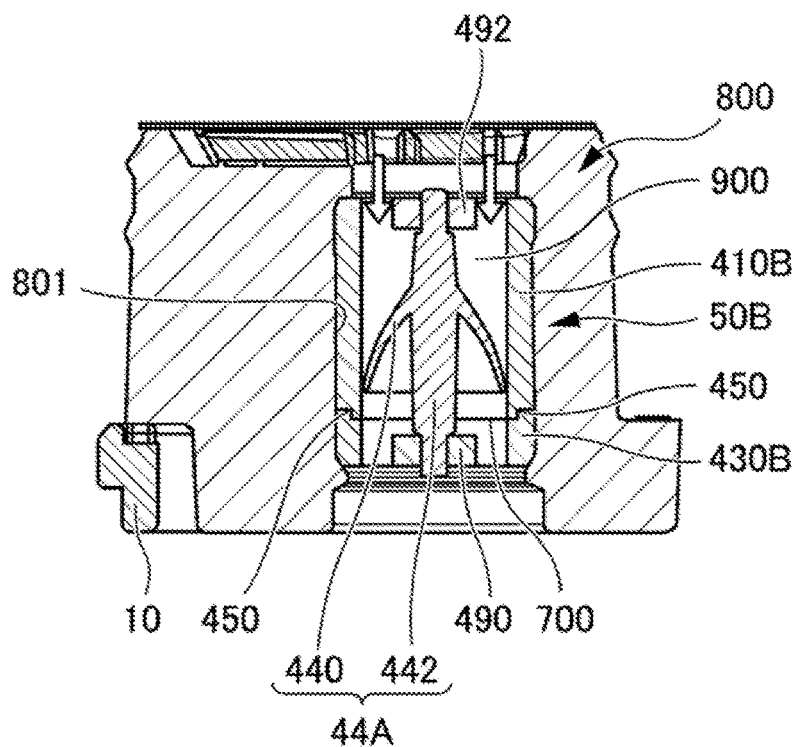
FIG. 5B is a sectional view of the communication passage provided with the valve according to the Example 2.

The first cylinder portion 410 B and the second cylinder portion 430B abut each other in the top-bottom direction. That is, the first cylinder portion 410B and the second cylinder portion 430B are coupled in a manner that an upper end surface of the first cylinder portion 410B abuts a lower end surface of the second cylinder portion 430B. The upper end surface of the first cylinder portion 410B abuts the lower end surface of the second cylinder portion 430B over the entire circumference around the shaft portion 442, when viewed in the top-bottom direction. As shown in FIGS. 5A and 5B, the upper end surface of the first cylinder portion 410B and the lower end surface of the second cylinder portion 430B may have steps 450 in the top-bottom direction which are complementary to each other. Thus, the airtightness can be enhanced between the upper end surface of the first cylinder portion 410B and the lower end surface of the second cylinder portion 430B.

The first cylinder portion 410B cooperates with the second cylinder portion 430B to form a communication passage 900 for communication between the outside of the container body 10 and the inside of the container body 10. The first cylinder portion 410B forms a lower supporter 492, while the second cylinder portion 430B forms an upper supporter 490.

The abutment position of the first cylinder portion 410B and the second cylinder portion 430B (indicated by 700 in FIG. 5A) is located on an open side of the umbrella shape of the seal lip 440 as compared to the seal lip 440 of the elastic body 44 (i.e. the abutment position is located on the upper side of the seal lip 440). However, in a variant, the abutment position of the first cylinder portion 410B and the second cylinder portion 430B may be located on the opposite side. In either case, since the rubber member 800 is in close contact between the container body 10 and the valve 50B in Example 2, the possibility of gas leakage through the abutment position of the first cylinder portion 410B and the second cylinder portion 430B is lower than that in Example 1.

FIG. 5B is a sectional view of a part including the valve 50B that communicates with the air exhaust unit 17. The valve 50B differs from the valve 40B in that the elastic body 44 is replaced with the elastic body 44A. The elastic body 44A is mounted in an inverted orientation upside down with respect to the elastic body 44. Similarly, the abutment position of the first cylinder portion 410B and the second cylinder portion 430B (indicated by 700 in FIG. 5B) is located on an open side of the umbrella shape of the seal lip 440 as compared to the seal lip 440 of the elastic body 44 (i.e. the abutment position is located on the lower side of the seal lip 440). However, in a variant, the abutment position of the first cylinder portion 410B and the second cylinder portion 430B may be located on the opposite side. In either case, since the rubber member 800 is in close contact between the container body 10 and the valve 50B in Example 2, the possibility of gas leakage through the abutment position of the first cylinder portion 410B and the second cylinder portion 430B is lower than that in Example 1.

Example 2 also provides the same effects as in Example 1 described above. According to Example 2, since the first cylinder portion 410B and the second cylinder portion 430B are separate bodies, the workability is good in mounting the elastic body 44 to the first cylinder portion 410B and the second cylinder portion 430B.

Figure 6:
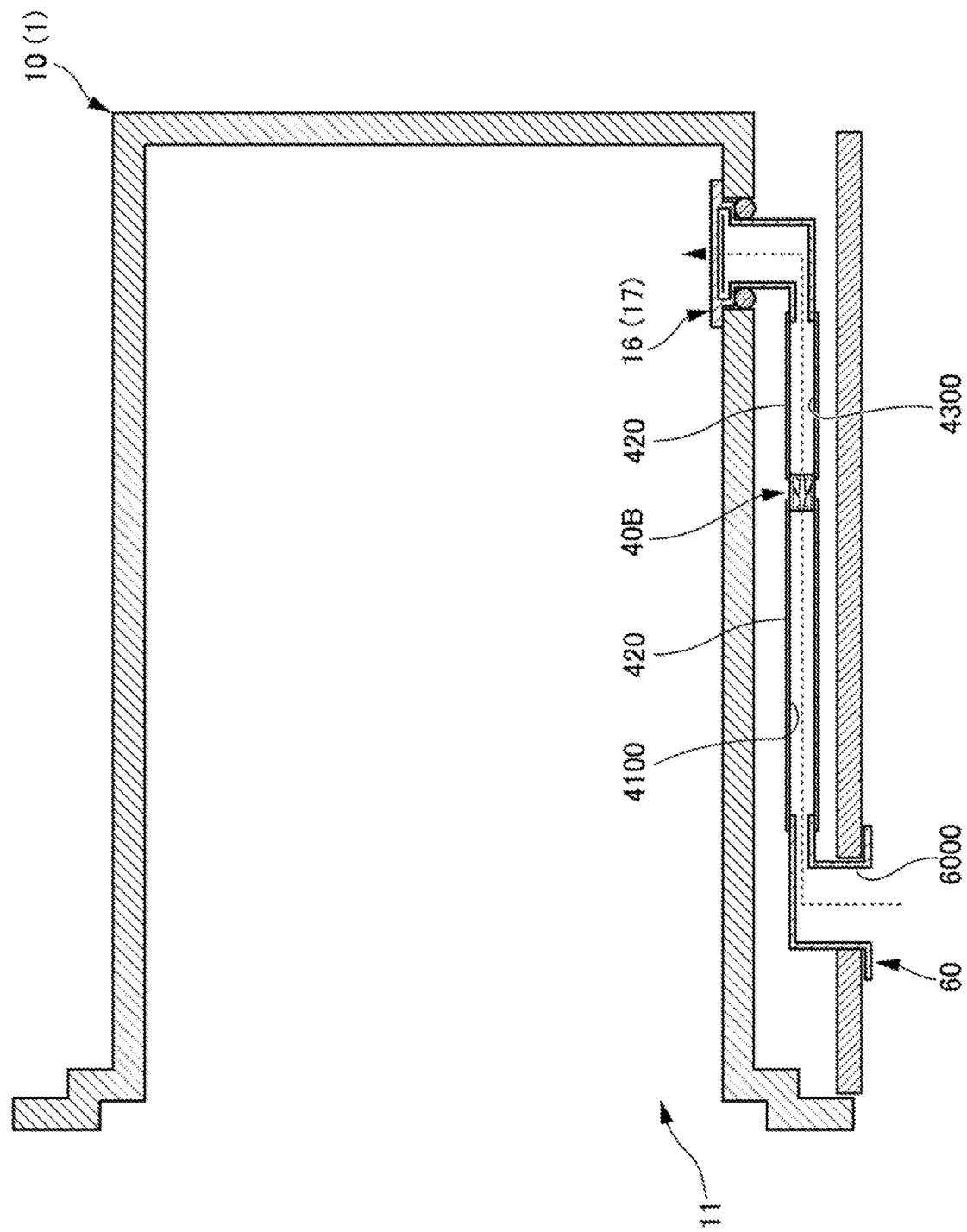
FIG. 6 is a schematic sectional view showing a valve in a container body according to Example 3.

[Example 3] FIG. 6 is a schematic sectional view showing a valve 40B in a container body 10 according to Example 3. FIG. 6 shows the valve 40B very schematically.

As shown in FIG. 6, a gas introduction unit 60 is located on the opening 11 side of the container body 10, and is coupled to a gas supply line from an external gas supply source. A communication passage 420 communicates with the gas introduction unit 60. The communication passage 420 is provided with the valve 40B. The communication passage 420 is a flexible tube into which the valve 40B is fitted. In the case where the valve (not shown) is provided for the air exhaust unit 17, the valve is mounted in the communication passage that communicates with the air exhaust unit 17 so that the orientation of the elastic body is opposite to the orientation shown in FIG. 6.

Since even the substrate storage container 1 of Example 3 includes the valve 40B which do not use any metallic member, metallic corrosive residual materials, if any, on the substrates W to be stored do not cause metallic corrosion problems, and it is unlikely that the valve 40B become inoperative.

The distance is long from the gas introduction unit 60 to the valve 40B. Further, an interior path 6000 of the gas introduction unit 60 is bent at a substantially right angle toward the first passage 4100 of the first cylinder portion 410. Therefore, even when the container body 10 is cleaned with a liquid, the liquid is unlikely to reach the valve 40B, preventing the liquid from remaining after drying of the container body 10. In addition, the liquid never reaches the air supply unit 16 and the air exhaust unit 17, since the units 16, 17 are on the further side than the valve 40B (the elastic body 44).

[Example 4] Described hereinafter as Example 4 are some variations of the configuration of the seal lip which can reduce the opening pressure.

In Example 4, the seal lip (such as the seal lip 440C) has different thicknesses between the first region and the second region in the circumferential direction about the center, when viewed from above (when viewed from top to bottom). That is, in Example 1 described above, the seal lip 440 has a uniform thickness in the circumferential direction about the center. On the other hand, in Example 4, the seal lip (such as the seal lip 440C) has different thicknesses between the first region and the second region in the circumferential direction about the center, which will be described below.

Figure 7A:
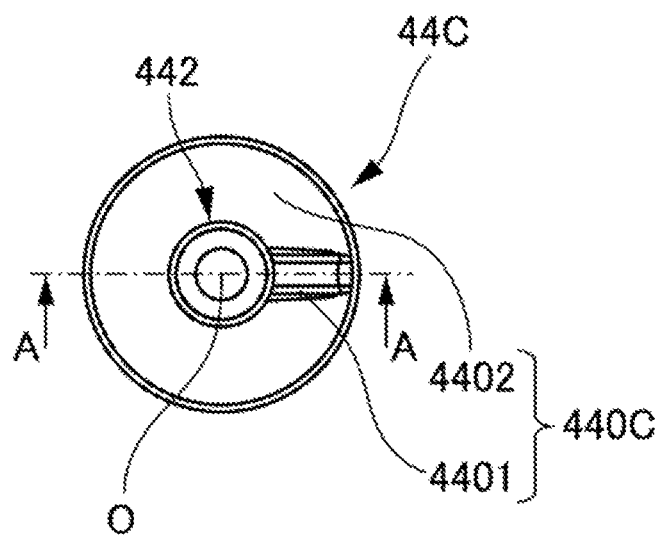
FIG. 7A is a plan view showing an elastic body according to Example 4.
Figure 7B:
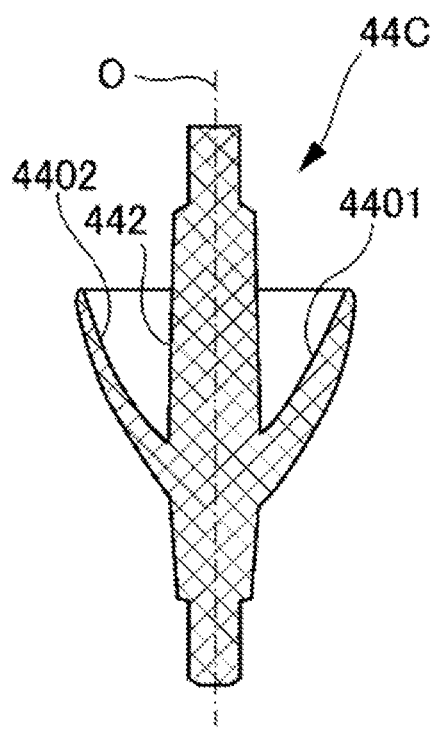
FIG. 7B is a sectional view taken along line A-A of FIG. 7A.

FIG. 7A is a plan view showing the elastic body 44C. FIG. 7B is a sectional view taken along line A-A of FIG. 7A. In FIG. 7A, the center of the seal lip 440C is denoted by reference sign "O". The center O of the seal lip 440 C coincides with the center of the shaft portion 442. Hereinafter, for the sake of explanation, the radial direction refers to a radial direction of the seal lip (such as the seal lip 440C) with respect to the center O. The circumferential direction refers to a circumferential direction of the seal lip (such as the seal lip 440C) with respect to the center O.

Note that, in FIG. 7B, the shaft portion 442 has the outer diameter that is not uniform along the top-bottom direction, except for parts to be supported by the supporters 490 and 492. This form is from the viewpoint of manufacturability (i.e. the viewpoint of die cutting).

As shown in FIG. 7A, the elastic body 44C has the thickness that varies between the first region 4401 and the second region 4402 in the circumferential direction about the center O.

More specifically, the elastic body 44C is thicker in the first region 4401 than in the second region 4402. The thickness of the first region 4401 is preferably 1.2 to 1.5 times the thickness of the second region 4402.

The first region 4401 is in a strip-like form extending from an inner side (the shaft portion 442 side) to an outer side in the radial direction, as shown in FIG. 7A. In the example shown in FIG. 7A, the width of the strip-like form of the first region 4401 (the width in the direction perpendicular to its extending direction) is substantially uniform, but may vary. In the example shown in FIG. 7A, the first region 4401 extends entirely from the shaft portion 442 side to its front edge, but may extend only partially.

Since the elastic body 44C shown in FIGS. 7A and 7B is provided with the first region 4401 of which thickness is increased partially in the circumferential direction, the opening pressure can be reduced as compared with the case where the elastic body has the thickness same as the second region 4402 entirely along the circumferential direction. The opening pressure is, as described above, a pressure that enables gas flow, i.e. a pressure that forms a clearance (see the clearance C in FIG. 3B between the seal lip 440C and the inner peripheral wall of the communication passage.

Specifically, in the case where the thickness is configured to be uniform entirely along the circumferential direction like the seal lip 440 for example, the seal lip is deformed as a whole in relation to the differential pressure. Accordingly, the deformation occurs in a uniform manner in the circumferential direction. As a result, the elastic deformation amount of the entire seal lip 440 tends to be smaller.

On the other hand, according to the seal lip 440C, only the thinner portion (i.e. the second region 4402) is significantly deformed in relation to the differential pressure, so that the deformation amount of the thinner portion can be increased. In particular, parts of the second region 4402 adjoining the first region 4401 in the circumferential direction, the deformation amount tends to increase. Hence, according to the elastic body 44C shown in FIGS. 7A and 7B, the deformation amount of the second region 4402 is larger than that of the whole seal lip 440 of the elastic body 44 in relation to the same differential pressure, thereby reducing the opening pressure.

Note that, in FIGS. 7A and 7B, the side to be thickened in the first region 4401 (the side in which the thickness is increased) of the elastic body 44C is the upper side. In other words, the elastic body 44C is thickened on the inner surface of the umbrella-like form on the first region 4401. However, in a variant, the outer side of the umbrella-like form may be thickened, or may be thickened on both sides.

Figure 8A:
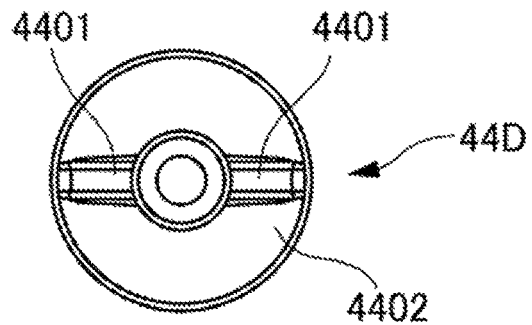
FIG. 8A is a plan view showing an elastic body of another variation.
Figure 8B:
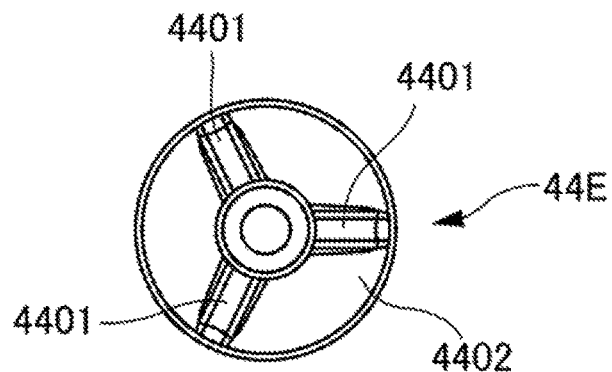
FIG. 8B is a plan view showing an elastic body of another variation.
Figure 8C:
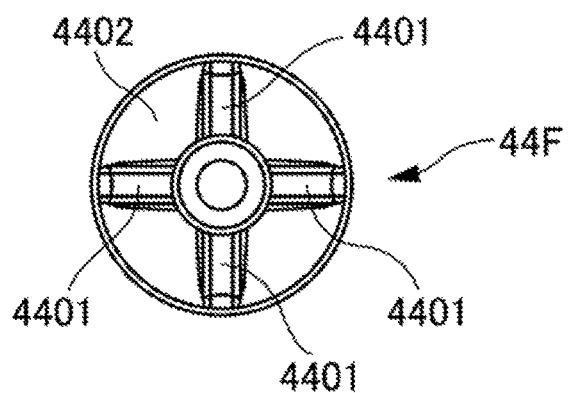
FIG. 8C is a plan view showing an elastic body of another variation.

FIGS. 8A, 8B and 8C are plan views showing other variations.

In examples shown in FIGS. 8A, 8B and 8C, the first region 4401 is provided at a plurality of locations in a manner away from each other in the circumferential direction about the center O in top view (viewed from the top to the bottom).

Specifically, in the example shown in FIG. 8A, the first regions 4401 is provided at two positions in a manner away from each other in the circumferential directions about the center O in top view. In the example shown in FIG. 8A, the two first regions 4401 are at a diagonal positional relationship, but may not be a diagonal positional relationship.

In the example shown in FIG. 8B, the first region 4401 is provided at three positions in a manner away from each other in the circumferential directions about the center O in top view. In the example shown in FIG. 8B, the three first regions 4401 are provided every 120 degrees in the circumferential direction, but may be arranged in different manners.

In the example shown in FIG. 8C, the first region 4401 is provided at four positions in a manner away from each other in the circumferential directions about the center O in top view. In the example shown in FIG. 8C, the four first regions 4401 are provided every 90 degrees in the circumferential direction, but may be arranged in different manners.

Also according to the examples shown in FIGS. 8A to 8C, since the first region 4401 of which thickness is increased partially in the circumferential direction is provided, the opening pressure can be reduced as compared with the case where the elastic body has the thickness same as the second region 4402 entirely along the circumferential direction. In addition, since the first region 4401 is provided at a plurality of locations, parts of the second regions 4402 adjoining the first regions 4401 in the radial direction increase. As described above, the parts of the second regions 4402 adjoining the first regions 4401 in the radial direction tend to be easily deformed. Therefore, providing the first regions 4401 at a plurality of locations makes it expectable to further reduce the opening pressure.

Examples have been described in detail. However, the present disclosure is not limited to the specific Examples, and various variations and modifications can be made within the scope of the description in the claims. It is also possible to combine all or some of the components of Examples described above.

Figure 9:
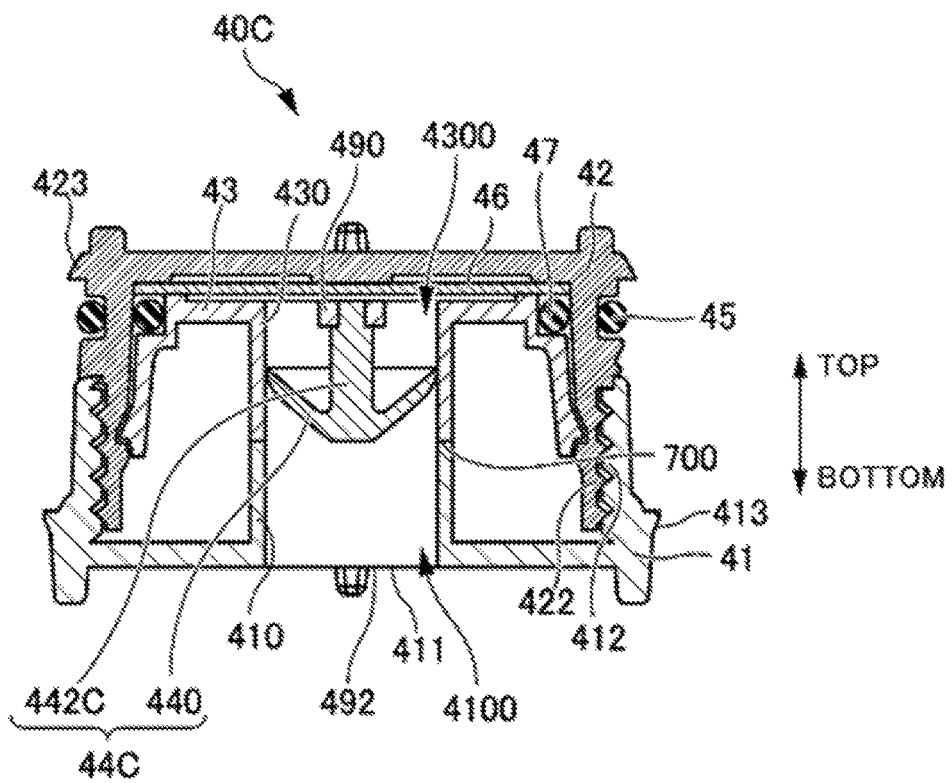
FIG. 9 is a schematic sectional view showing a valve according to a variant.

For example, in Example 1 (also in Example 2 and Example 3) described above, the at least one valve 40 (also the at least one valve 50) includes the shaft portion 442 extending upward and downward continuously from the seal lip 440. However, the configuration is not limited thereto. For example, like an elastic body 44C of a valve 40C shown in FIG. 9, a shaft portion 442C may be provided so as to extend continuously from the seal lip 440 only upwardly. Although not shown, the shaft portion may be provided so as to extend continuously from the seal lip 440 only downwardly.

Figure 10:
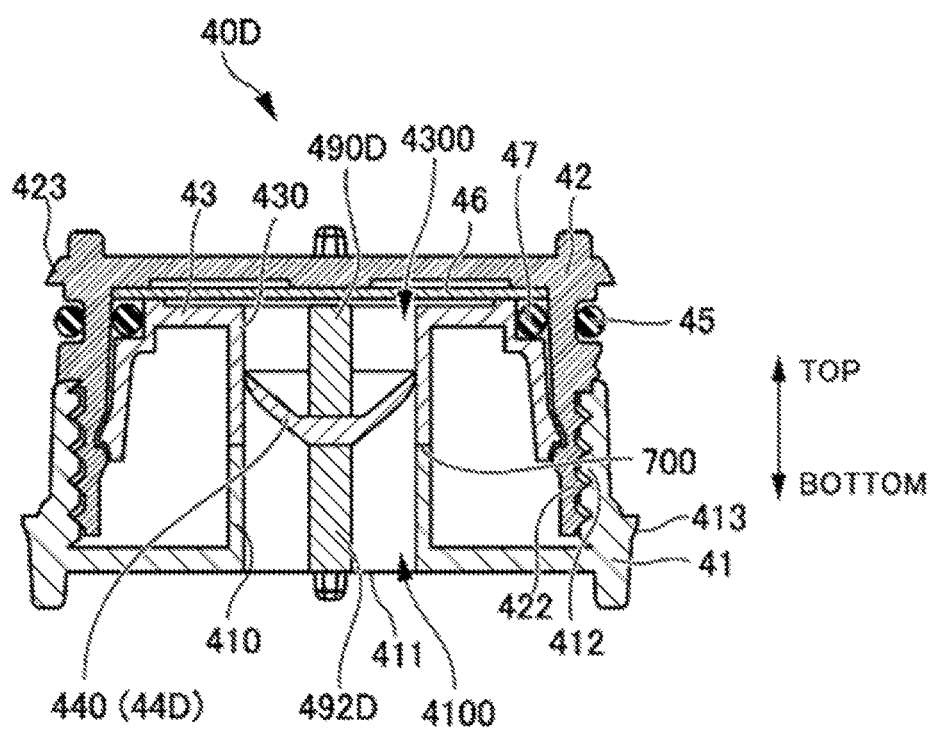
FIG. 10 is a schematic sectional view showing a valve according to a variant.

In addition, in Example 1 described above (also in Example 2 and Example 3), the shaft portion 442 is a part of the elastic body 44, but is not limited thereto. For example, the shaft portion 442 may be formed separately from the seal lip 440. For example, the shaft portion 442 may be a member that is made of resin and extends in the top-bottom direction between the upper and lower supporters 490, 492. Alternatively, like an elastic body 44D of a valve 40D shown in FIG. 10, upper and lower supporters 490D and 492D may support the seal lip 440 of the elastic body 44D in a manner to sandwich from above and below. In this case, either one of the supporters 490D, 492D may be omitted, and the seal lip 440 may be adhered to the other one of the supporters 490D, 492D.

REFERENCE SIGNS LIST 1 substrate storage container,
10 container body,
11 opening,
12 seal face,
13 support body,
14 robotic flange,
15 manual handle,
16 air supply unit,
17 air exhaust unit,
18 through hole,
20 lid,
21 attachment groove,
22 convex portion,
30 packing,
40 valve,
40B, 40C, 40D valve,
41 fixation cylinder,
42 hold cylinder,
43 inner lid cylinder,
44 elastic body,
44A elastic body,
44C elastic body,
45 seal member,
46 filter,
47 seal member,
50 valve,
60 gas introduction unit, 180 rib,
410 first cylinder portion,
410B first cylinder portion,
411 vent,
412 thread groove,
413 flange,
420 communication passage,
421 vent,
422 thread groove,
423 flange,
424 partition rib,
430 second cylinder portion,
430B second cylinder portion,
440, 440C seal lip,
442 shaft portion,
490 supporter,
492 supporter,
900 communication passage,
4100 first passage,
4300 second passage,
4401 first region,
4402 second region,
6000 interior path,
C clearance,
O center,
W substrate.

The invention claimed is:

1. A substrate storage container, comprising:
a container body for storing at least one substrate;
a lid for closing an opening of the container body; and
at least one valve for controlling gas flow to the container body or from the container body,
wherein the at least one valve comprises a shaft portion that extends along a first direction and an elastic, non-metallic seal lip in a communication passage that extends in the first direction and communicates between an outside of the container body and an inside of the container body, and
wherein the seal lip extends around the shaft portion when viewed in the first direction to form a substantially umbrella shape which closes to be coupled to the shaft portion on one side in the first direction and opens on the other side in the first direction,
wherein the communication passage is partitioned by the seal lip into a first passage that communicates with the outside of the container body and a second passage that communicates with the inside of container body, and
wherein an end of the seal lip on the other side is configured to elastically deform in a manner away from the inner peripheral wall of the communication passage to fluidly connect the first passage to the second passage when a pressure to the seal lip applied from a close side toward an open side of the substantially umbrella shape is higher than a pressure to the seal lip applied from the open side toward the close side of the substantially umbrella shape by a predetermined value or more, otherwise the end of the seal lip on the other side abuts an inner peripheral wall of the communication passage to block the fluid communication between the first passage and the second passage.

2. The substrate storage container according to claim 1, further comprising:
a first circular cylindrical part and a second circular cylindrical part which abut each other in the first direction and form the communication passage, and
wherein at least one of the first circular cylindrical part and the second circular cylindrical part supports an end of the shaft portion in the first direction.

3. The substrate storage container according to claim 2, wherein the first circular cylindrical part supports one end side of the shaft portion in the first direction, and
the second circular cylindrical part supports the other end side of the shaft portion in the first direction.

4. The substrate storage container according to claim 2, wherein a position where the first circular cylindrical part and the second circular cylindrical part abut in the first direction is located on the other side in the first direction than a position where the seal lip abuts the inner peripheral wall.

5. The substrate storage container according to claim 1, wherein the seal lip has a first region and a second region in a circumferential direction about a center when viewed in the first direction, the first region and the second region having different thicknesses.

6. The substrate storage container according to claim 5, wherein the first region has a substantially strip form extending from the one side to the other side, the first region having the thickness greater than the thickness of the second region.

7. The substrate storage container according to claim 6, wherein the first region is provided at a plurality of locations in a manner away from each other in the circumferential direction about a center when viewed in the first direction.

* * * * *